United States Patent [19]

Lur et al.

[11] Patent Number: 5,466,627
[45] Date of Patent: Nov. 14, 1995

[54] STACKED CAPACITOR PROCESS USING BPSG PRECIPITATES

[75] Inventors: Water Lur, Taipei; Jenn-Tarng Lin, Wann Hwa Area; Hsiaw-Sheng Chin, Bann-Chyau, all of Taiwan

[73] Assignee: United Microelectronics Corporation, Hsin-Chu, Taiwan

[21] Appl. No.: 214,608

[22] Filed: Mar. 18, 1994

[51] Int. Cl.⁶ .............................. H01L 21/70; H01L 27/00
[52] U.S. Cl. ................... 437/52; 437/919; 437/60
[58] Field of Search .................. 156/659.1; 257/309; 437/52, 60, 919

[56] References Cited

U.S. PATENT DOCUMENTS

| | | |
|---|---|---|
| 4,859,622 | 8/1989 | Eguchi . |
| 5,068,199 | 11/1991 | Sandhu . |
| 5,110,752 | 5/1992 | Lu . |
| 5,112,773 | 5/1992 | Tuttle ........................... 437/109 |
| 5,134,086 | 7/1992 | Ahn et al. . |
| 5,158,905 | 8/1992 | Ahn ............................... 437/52 |
| 5,164,881 | 11/1992 | Ahn ............................... 361/313 |
| 5,169,803 | 12/1992 | Miyakawa ..................... 437/197 |
| 5,182,232 | 6/1993 | Chhabra et al. . |
| 5,204,280 | 4/1993 | Dhong et al. . |
| 5,213,992 | 5/1993 | Lu . |
| 5,227,322 | 7/1993 | Ko et al. . |
| 5,232,876 | 8/1993 | Kim et al. ..................... 437/233 |
| 5,234,857 | 8/1993 | Kim et al. ..................... 437/47 |
| 5,244,842 | 9/1994 | Cathey et al. . |
| 5,254,503 | 10/1993 | Kenney . |
| 5,256,587 | 10/1993 | Jun et al. . |
| 5,302,540 | 4/1994 | Ko et al. . |
| 5,304,828 | 4/1994 | Kim et al. ..................... 257/309 |
| 5,308,786 | 5/1994 | Lur et al. . |
| 5,313,100 | 5/1994 | Ishii et al. . |
| 5,332,696 | 6/1994 | Kim et al. . |
| 5,342,800 | 8/1994 | Jun et al. . |
| 5,350,707 | 9/1994 | Ko et al. . |
| 5,405,801 | 4/1995 | Han et al. ..................... 437/60 |

FOREIGN PATENT DOCUMENTS

| | | |
|---|---|---|
| 2308551 | 12/1990 | Japan . |
| 3266460 | 11/1991 | Japan ............................ H01L 27/04 |

OTHER PUBLICATIONS

'Method of Increasing Capacitance Area Using RIE Selectivity', IBM Technical Disclosure Bulletin, vol. 35, No. 7, (p. 464), Dec. 1992.

'The Fabrication and Electrical Properties of Modulated Stacked Capacitor for Advanced DRAM Applications', IEEE Electron Device Letters, vol. 13, No. 8, Aug. 1992, p. 430.

Wolf et al., *Silicon Processing for the VLSI Era*, vol. 1, Lattice Press 1986, pp. 400–401, 581.

Jun et al., *The Fabrication and Electrical Properties of Modulated Stacked Capacitor for Advanced DRAM Applications*, IEEE (1992).

IBM Technical Disclosure, *Method of Increasing Capacitance Area Using RIE Selectivity*, vol. 35, No. 7 (Dec. 1992).

*Primary Examiner*—R. Bruce Breneman
*Assistant Examiner*—Matthew Whipple

[57] ABSTRACT

A MOST capacitor for use in a DRAM is formed by using BPSG precipitates after densification as a mask for etching a BPSG layer to form BPSG islands. The BPSG islands are then used as a mask for etching a polysilicon layer to form pillars in the polysilicon layer.

6 Claims, 3 Drawing Sheets

STACKED CAPACITOR PROCESS USING BPSG PRECIPITATES

FIELD OF THE INVENTION

The present invention relates to a technique for forming a modulated stacked capacitor for use in a Dynamic Random Access Memory (DRAM) cell.

BACKGROUND OF THE INVENTION

A DRAM cell typically comprises a MOS transistor and a capacitor. An example of such a DRAM cell is shown in FIG. 1. The DRAM cell 10 of FIG. 1 comprises the MOSFET 12 and the capacitor 14. A word line is connected to the gate of the MOSFET 12. A bit line is connected to the source of the MOSFET 12. The capacitor 14 is connected to the drain of the MOSFET 12. The state of the DRAM cell 10 is determined by whether or not the capacitor 14 is holding a charge.

The DRAM cell is read by using the bit line to determine whether or not a charge is stored in the capacitor. The DRAM cell is written by using the bit line to add or remove charge from the capacitor. However, the cell can only be read or written when the cell is addressed (i.e. activated) by the word line.

With the continuous advancement of DRAM technology, the chip area used for one DRAM cell is getting smaller. There are two methods used to increase the capacitance of the capacitor in the DRAM cell. One method is to decrease the effective dielectric thickness and the other method is to increase the effective capacitor surface area.

It is expected that future scaled DRAM cells will rely heavily on the quality and storage capacity of ultra thin dielectric materials that are sandwiched between two heavily doped polysilicon and/or silicon electrodes. However, higher capacitance values cannot be obtained without seriously degrading the device retention time. Specifically, films thinner than 50 angstroms present excessive leakage current due to direct carrier tunneling. For a given capacitor dielectric film, the larger the surface area, the larger the capacitance.

FIGS. 2, 3, 4, 5 and 6 illustrate prior art DRAM cells. The DRAM cell 20 of FIG. 2 comprises a MOSFET 22 and a capacitor 24 which are both formed on a silicon substrate 25. The MOSFET 22 comprises the source and drain regions 26 and 28, which regions are separated by the channel 29. It should be noted that the source and drain regions 26, 28 have a conductivity type opposite to that of the substrate. A metal contact 27 directly contacts the source region 26. A gate 30 is formed from polysilicon material (Poly-1) and is separated from the surface of the substrate by an oxide layer 31. An additional oxide region 32 is on top of the gate 30.

The capacitor 24 sits on top of the drain region 28. The capacitor 24 has a first electrode 40 formed by a conducting polysilicon material (poly-2), a thin dielectric layer 42 which may be NO or ONO, and a second electrode 44 which is formed from a conducting polysilicon material (poly-3). The capacitor contacts the drain region 28 in a space between the oxide region 32 and the oxide region 52.

FIG. 3 shows a DRAM cell 20' which is similar to the DRAM cell 20 of FIG. 2. The main difference is that the shape of the poly-2 electrode layer 40, dielectric layer 42 and poly-3 electrode layer 44 have been altered to increase the surface area of the capacitor 24.

FIG. 4 shows a DRAM cell 20" in which the poly-2 electrode 40 has been made rugged to increase the surface area of the capacitor.

FIG. 5 shows a DRAM cell 20''' in which the polysilicon electrode 40 is formed from a plurality of horizontal layers 41 to increase the surface area of the capacitor.

Another capacitor structure which can be used to increase the capacitance of a DRAM cell is known as MOST (modulated stacked) capacitor. (See e.g. Y. K. Jun et al, "The Fabrication and Electrical Properties of Modulated Stacked Capacitor for Advance DRAM Applications" IEEE Electron Device Letters, Vol. 13, No. 8, August 1992, the contexts of which are incorporated herein by reference).

A DRAM cell 20'''' having a MOST capacitor structure is illustrated in FIG. 6. In the capacitor 24 of FIG. 6, the poly-2 electrode 40 comprises a plurality of spaced apart vertical pillars 43. The capacitor dielectric 42 and poly-3 electrode 44 are then deposited over the spaced apart vertical pillars 43. In this manner a capacitor with a large effective surface area is formed in a DRAM cell.

It is an object of the present invention to provide a technique for manufacture of a MOST capacitor for use in a DRAM cell.

SUMMARY OF THE INVENTION

The present invention is a method for making a MOST capacitor for use in a DRAM cell. A technique for making a MOST capacitor for use in a DRAM cell utilizes BPSG precipitates after BPSG densification. The BPSG precipitates are used as a mask to selectively form deep grooves in a polysilicon electrode of the capacitor.

DETAILED DESCRIPTION OF THE INVENTION

The technique for forming the MOST capacitor is illustrated in FIGS. 7(a), 7(b), 7(c) and 7(d).

Figure 1:
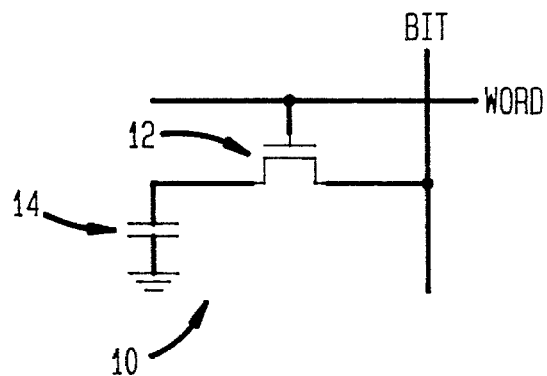
FIG. 1 schematically illustrates DRAM cell.
Figure 2:
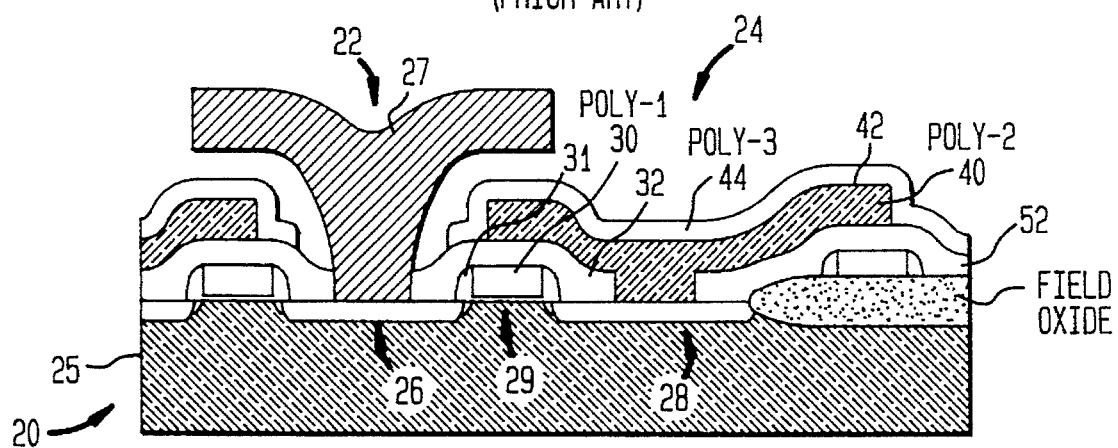
FIGS. 2–6 illustrate various prior art capacitors utilized in DRAM cells.
Figure 3:
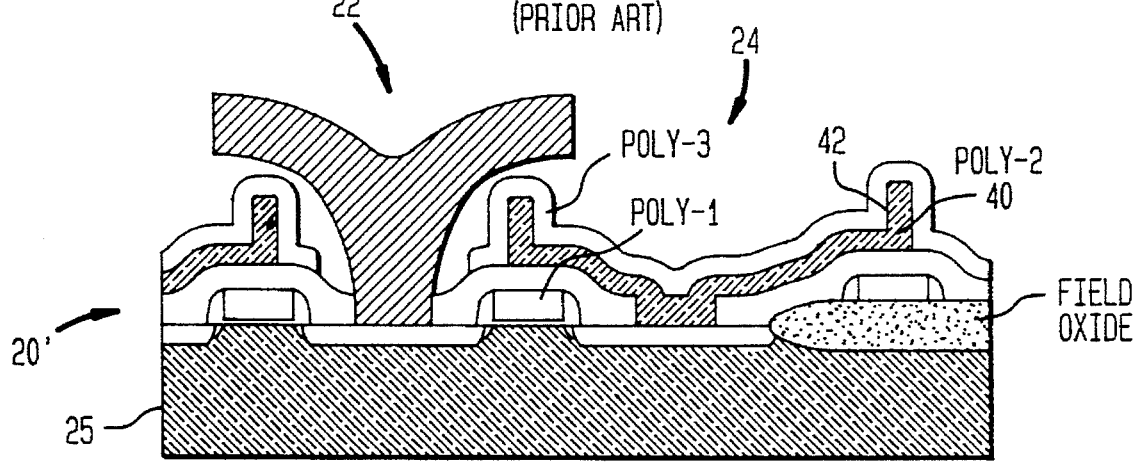
Figure 4:
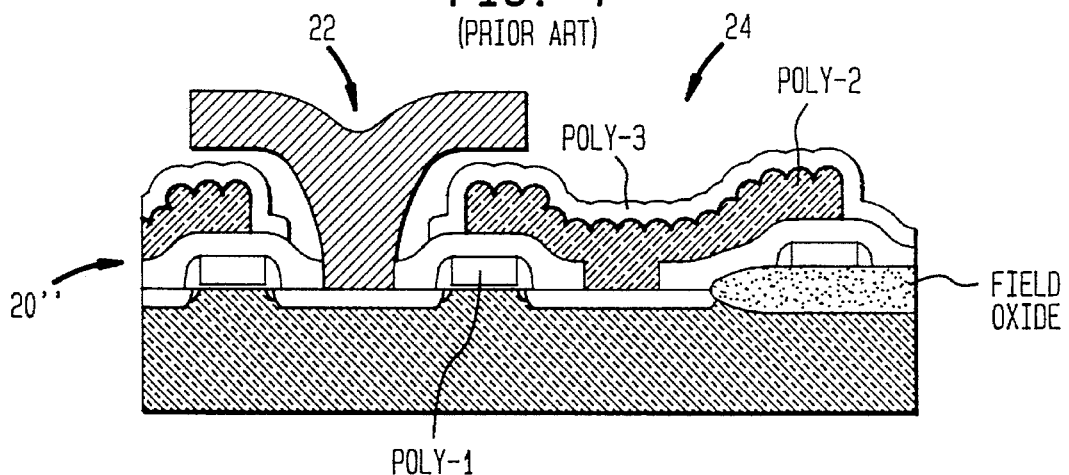
Figure 5:
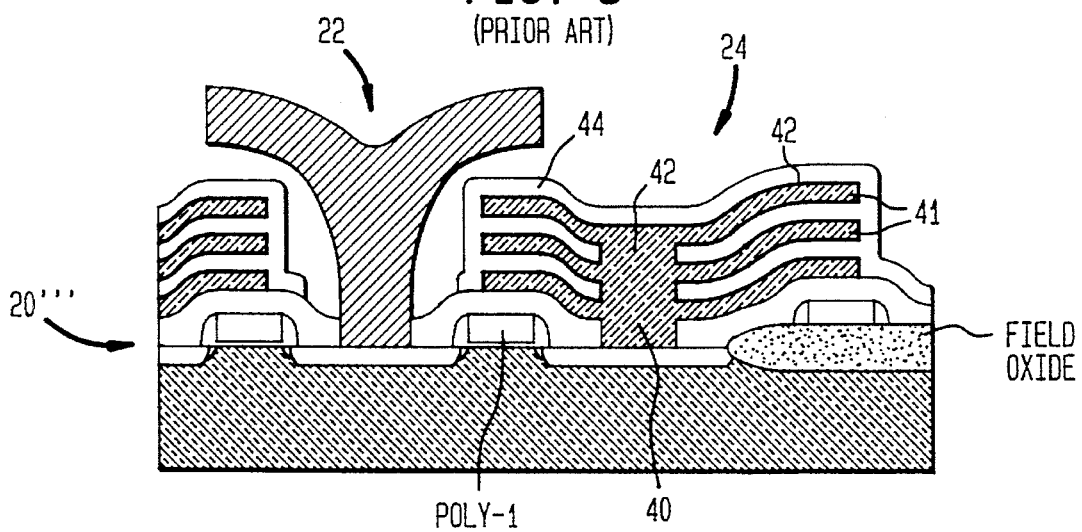
Figure 6:
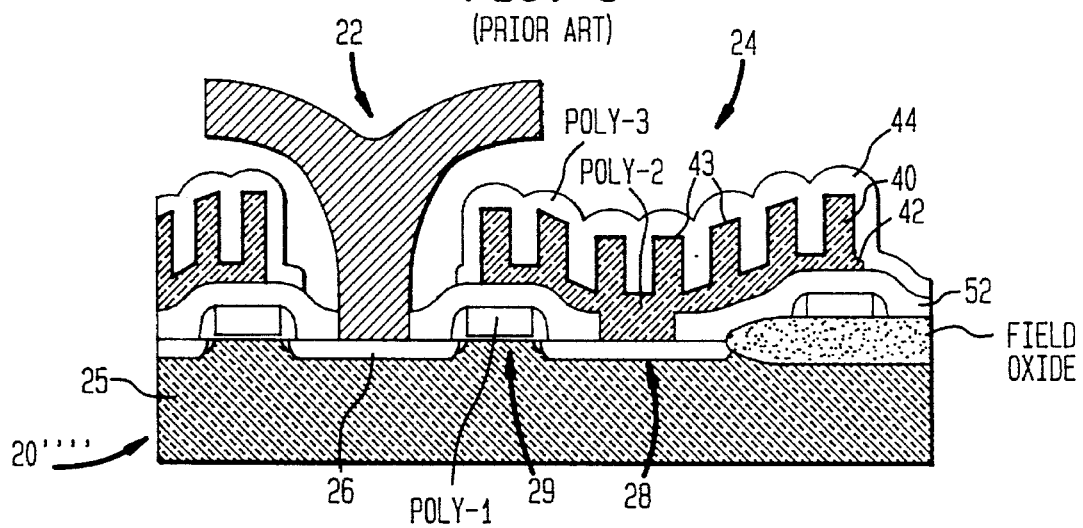
Figure 7A:
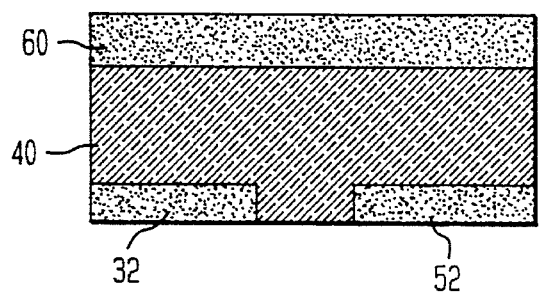
FIGS. 7(a), 7(b), 7(c), and 7(d) illustrate a technique for forming a MOST capacitor for use in a DRAM cell in accordance with the present invention.

1. As shown in FIG. 7(a), a polysilicon (Poly-2) electrode layer 40 is deposited on top of the oxide regions 32 and 52 and on top of the substrate 25 (not shown in FIG. 7(A), but see FIGS. 2–6). The polysilicon electrode layer 40 has a thickness of 5,000 to 10,000 Angstroms and is deposited by chemical vapor deposition or a similar technique after the formation of poly contacts.

2. The polysilicon layer 40 is doped with $POCl_3$ or is implanted with phosphorous or arsenic or the like to become conductive.

3. A borophosphosilicate glass (BPSG) containing 4–10 wt % boron, 5–12 wt % phosphorous, is deposited onto the polysilicon layer 40 with a thickness of between 2,000 to 10,0000 Angstroms. The BPSG layer is designated 60 in FIG. 7(a). The BPSG layer 60 is deposited using chemical vapor deposition with reaction gases of $SiH_4$ or $Si(C_2H_5O)_4$ and $O_2$ or $O_3$.

Figure 7B:
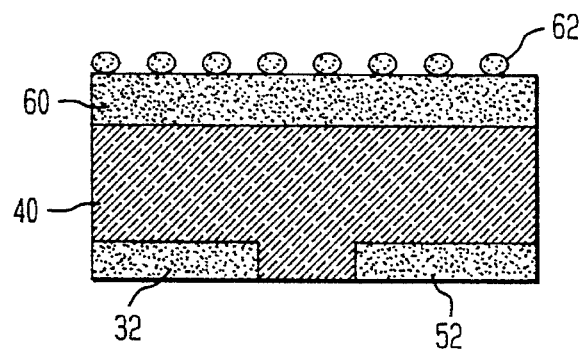

4. The BPSG layer 60 is then thermally densified at a temperature of 800° C.–1000° C. in an $O_2$ or $N_2$ ambient to form an SiO₂ structure. The boron and phosphorous that exceed solubility in the SiO₂ structure form BPO₄ or similar precipitates 62 on the BPSG layer 60 as shown in FIG. 7(b). The precipitates 62 have a size between 0.05 and 0.2 microns.

Figure 7C:
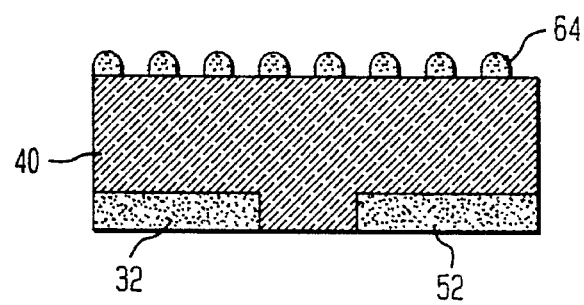

5. Using the BPSG precipitates 62 as a mask, the BPSG layer 60 is etched to form multiple BPSG islands 64 as shown in FIG. 7(c). The size of the BPSG islands 0.05–0.2 microns. The etching technique used to etch the BPSG layer may be a fixed time or end point etching technique.

Figure 7D:
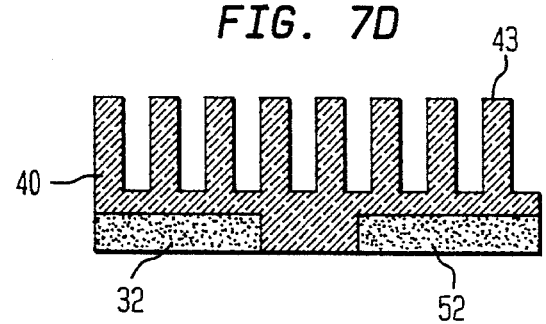

6. Using the residual BPSG islands 64 as a mask, the underlying polysilicon electrode layer 40 is then etched to a depth of about 4,000–8,000 Angstroms to form the pillars 43. The BPSG islands are then dipped away using HF-content solution. The resulting polysilicon electrode layer with pillars 43 is shown in FIG. 7(d).

7. The capacitor dielectric layer 42 (see FIG. 6) is then deposited on the polysilicon electrode layer 40. The capacitor dielectric layer is made of ON or ONO or the like and is formed on the now modulated surface (i.e., modulated with pillars) of the electrode layer 40 using CVD or PVD or thermal treatments.

8. The dielectric layer 42 and electrode layer 40 are etched to isolate the capacitor from the rest of the structures on the substrate.

9. Another polysilicon electrode layer 44 (see FIG. 6) is formed on the dielectric layer 42, doped to become conducting, and then etched to complete the capacitor.

10. Another dielectric layer, (not shown), usually BPSG or the like, is deposited on the polysilicon electrode layer 44 and etched for the formation of metal contacts.

11. The metal layer is then formed and etched to complete the DRAM structure.

In short, a technique for forming a MOST capacitor for use in a DRAM has been disclosed. Finally, the above described embodiments of the invention are intended to be illustrative only. Numerous alternative embodiments may be devised by those skilled in the art without departing from the spirit and scope of the following claims.

We claim:

1. A method for making a capacitor for use in a DRAM cell comprising the steps of
    a) forming a conductive polysilicon layer on a silicon substrate,
    b) forming a glass layer on the polysilicon layer containing a precipitable material,
    c) treating the glass layer so that said precipitable material is precipitated out of the glass layer to form precipitates thereon,
    d) using the precipitates as a mask, etching the glass layer to form glass islands,
    e) using the glass islands as a mask, etching the polysilicon layer to from a plurality of pillars,
    f) depositing a dielectric layer on the etched polysilicon layer, and
    g) depositing a second polysilicon layer on the dielectric layer.

2. The method of claim 1 wherein said glass is BPSG.

3. The method claim 1 wherein said islands have a size in the range of 0.05–0.2 microns.

4. The method of claim 1 wherein said treating step comprises thermally treating the glass layer to form said precipitates.

5. The method of claim 1 wherein said treating step comprises thermally densifying said glass layer at a temperature of 800°–1000° C.

6. The method of claim 1 wherein said treating step comprises thermally densifying said glass layer to form an SiO₂ structure containing residual soluble precipitable material.

* * * * *